(12) United States Patent
Qian et al.

(10) Patent No.: US 12,035,449 B2
(45) Date of Patent: Jul. 9, 2024

(54) KEYPAD OVERLAY WITH ELECTROSTATIC DISCHARGE DISSIPATION

(71) Applicant: Mettler-Toledo, LLC, Columbus, OH (US)

(72) Inventors: Long Qian, Changzhou (CN); Hao Cao, Changzhou (CN); Heming Song, Changzhou (CN); József Varga, Albstadt (DE); William Miller, Centerburg, OH (US)

(73) Assignee: Mettler-Toledo, LLC, Columbus, OH (US)

( * ) Notice: Subject to any disclaimer, the term of this patent is extended or adjusted under 35 U.S.C. 154(b) by 274 days.

(21) Appl. No.: 17/585,893

(22) Filed: Jan. 27, 2022

(65) Prior Publication Data

US 2022/0248521 A1    Aug. 4, 2022

(30) Foreign Application Priority Data

Jan. 29, 2021    (CN) .......................... 202110133181.5

(51) Int. Cl.
*H05F 3/04*    (2006.01)
*H01H 9/48*    (2006.01)
(Continued)

(52) U.S. Cl.
CPC ................ *H05F 3/04* (2013.01); *H01H 9/48* (2013.01); *H01H 13/70* (2013.01); *H05K 5/0017* (2013.01)

(58) Field of Classification Search
CPC ... C09D 165/00; C09D 5/24; G02F 1/133308; G02F 2202/22; G06F 1/1637; G06F 1/1643; G06F 1/1656; G06F 1/182; G06F 3/0202; G06F 3/041; G06F 3/0412; H01H 13/70; H01H 9/48; H05F 3/02; H05F 3/04; H05K 5/0017; H05K 9/0067
See application file for complete search history.

(56) References Cited

U.S. PATENT DOCUMENTS 5,807,002 A    9/1998    Tsai
6,023,033 A    2/2000    Yagi et al.
(Continued)

FOREIGN PATENT DOCUMENTS

GB            2095038 B      1/1985
KR    10-2018-0118336 A    10/2018

*Primary Examiner* — Jared Fureman
*Assistant Examiner* — Nicolas Bellido
(74) *Attorney, Agent, or Firm* — Standley Law Group LLP; Jeffrey S. Standley; Adam J. Smith (57) ABSTRACT

A plastic keypad with data entry elements and at least one display element is protected from electrostatic discharge by an assembly having an overlay substrate on which an electrically-conductive arrangement is disposed. The overlay substrate has a top side and a back side with a precisely-positioned vias formed through the substrate. A top surface of the top side is a layer of a conductive polymer. The back side is printed with at least one layer of color ink that depict a plurality of alpha-numerical and pictorial elements of the keypad. The electrically-conductive arrangement is disposed on the overlay substrate to collect electrostatic charges on the top side, transfer the electrostatic charges to the back side through the plurality of vias and drain the transferred electrostatic charges to a ground.

17 Claims, 6 Drawing Sheets

(51) Int. Cl.
　　　*H01H 13/70*　　　(2006.01)
　　　*H05K 5/00*　　　(2006.01)

(56) References Cited

U.S. PATENT DOCUMENTS

| | | | |
|---|---|---|---|
| 6,103,346 | A | 8/2000 | Nakajo et al. |
| D431,482 | S | 10/2000 | Marmier |
| 6,207,912 | B1 * | 3/2001 | Persson ................ H01H 13/702 |
| | | | 200/305 |
| 6,278,072 | B1 | 8/2001 | Nakajo |
| 6,413,598 | B1 | 7/2002 | Motoki et al. |
| D582,308 | S | 12/2008 | Kajita |
| 7,567,419 | B2 | 7/2009 | Lu et al. |
| D623,974 | S | 9/2010 | Shigeno et al. |
| D672,262 | S | 12/2012 | Holland et al. |
| 8,375,767 | B2 | 2/2013 | Zadesky et al. |
| 8,704,110 | B2 | 4/2014 | Forshaw et al. |
| 9,068,879 | B2 | 6/2015 | Taylor et al. |
| 9,347,820 | B2 | 5/2016 | Khanuja |
| 9,752,923 | B2 | 9/2017 | Izumo et al. |
| D813,067 | S | 3/2018 | Holland et al. |
| D830,212 | S | 10/2018 | Holland et al. |
| 10,194,514 | B2 | 1/2019 | Heidebrecht et al. |
| D856,179 | S | 8/2019 | Lee |
| 2005/0261019 | A1 | 11/2005 | Lee et al. |
| 2006/0279887 | A1 * | 12/2006 | Lu ........................ H05K 1/0256 |
| | | | 361/56 |
| 2009/0155579 | A1 * | 6/2009 | Greco .................... H01B 1/127 |
| | | | 428/336 |
| 2017/0135188 | A1 * | 5/2017 | Heidebrecht ..... G02F 1/133308 |

\* cited by examiner

KEYPAD OVERLAY WITH ELECTROSTATIC DISCHARGE DISSIPATION

CROSS-REFERENCE TO RELATED APPLICATIONS

This patent application claims a right of priority to Chinese application CN 202110133181.5, filed on 29 Jan. 2021, which is incorporated by reference as if fully recited herein.

TECHNICAL FIELD

The inventive concept relates to an overlay for a data entry and display keypad of an electronic device, in which the overlay is adapted to dissipate electrostatic charges that may arise through use. While useful in any surroundings, the overlay incorporating the inventive concept provides the electronic device with a keypad that can meet or exceed standardized tests for use in an environment in which the sudden flow of electrons across a gap could ignite a flammable mixture, resulting in fire or an explosive flame front.

BACKGROUND ART

All equipment intended to operate in a hazardous environment must be designed to prevent against an ignition spark which can cause a flame, or, if the flame can be propagated, an explosion. Almost every industry has hazardous environments that must be taken into account. Coal mines and grain elevators have been known to cause fuel-air explosions. Vapors such as gasoline, surgical anesthetics and ethyl alcohol have also been known to explode in the presence of an electrostatic discharge ("ESD"), which is a sudden flow of electrons across a gap. The fire in the US spaceship Apollo 1 was caused by ignition from a spark in the 100% oxygen atmosphere of the craft while sitting on the launch pad. Most people associate ESD with lightning, but a discharge of only a few centimeters can have enough current to cause ignition in a hazardous environment. Also, electronic components such as hard drives and integrated circuits are very vulnerable to ESD.

In the known art, plastic insulating materials are often used to construct a keyboard/display overlay, which is attached to the outside of a metal equipment enclosure. Due to its chemical properties, the plastic overlay can collect and hold a high energy static charge and then discharge suddenly, creating a potentially dangerous ignition spark, unless protective measures are employed to drain or dissipate the static charges as they arise.

In some solutions in the prior art, an indium-tin oxide (ITO) layer has been used in keypad assemblies to prevent electromagnetic interference (EMI) in a partial solution to this issue.

It is an unmet objective of the prior art to provide a multilayer keypad assembly in which charges are drained into a conductive interior layer of the keypad assembly, from which the charges are drained to a metal housing of the device with which the keypad assembly is associated. From there, the charges are connected to earth ground.

SUMMARY

These and other objectives are met by an assembly for protecting, from electrostatic discharge, a plastic keypad having data entry elements and at least one display element. The assembly comprises an overlay substrate and an electrically-conductive arrangement. The overlay substrate has a top side and a back side. It also has a plurality of precisely-positioned vias formed therethrough. The top side has a top surface coated with a layer of a conductive polymer and the back side has a back surface printed with at least one layer of color ink, the at least one layer of color ink depicting a plurality of alpha-numerical and pictorial elements of the keypad. The electrically-conductive arrangement is disposed on the overlay substrate to collect electrostatic charges on the top side, transfer the electrostatic charges to the back side through the plurality of vias and drain the transferred electrostatic charges to a ground.

In some of the embodiments, the electrically-conductive arrangement also comprises at least one first conductive grid printed onto the top surface of the overlay substrate beneath the layer of conductive polymer. This at least one first conductive grid divides the top surface into a plurality of surrounded areas, each of which is equal to or smaller than a predetermined size. Each of the first conductive grids comprises a plurality of nodes, wherein each node is positioned atop, and extending into, a corresponding one of the plurality of precisely-placed vias.

The electrically-conductive arrangement also comprises at least one second conductive grid printed onto the back surface of the overlay substrate, below the at least one layer of color ink. Each second conductive grid corresponds in size and shape to one of the first conductive grids, and each of the second conductive grids comprises a plurality of nodes, with each node positioned below, and extending into, a corresponding one of the plurality of precisely-placed vias.

The electrically-conductive arrangement also has at least one metal tab that communicates to ground each second conductive grid.

In some of the embodiments, each of the first conductive grids and the second conductive grids comprises lengths of a conductive paste printed on the overlay substrate. In that situation, a layer of color ink is applied atop the lengths of conductive paste in each of the first conductive grids.

Even further, the nodes of each of the first conductive grids comprise a plug of a conductive polymer applied to each of the precisely-positioned vias from the top side of the overlay substrate, a length of the conductive paste applied atop the plug; and a length of the color ink applied atop the length of conductive paste. In such a case, the plug has a body portion that extends into the via and a flange portion, having a diameter that is larger than a diameter of the via, that extends onto the top surface of the overlay substrate.

In many of the electrically-conductive arrangements, the nodes of each of the second conductive grids comprises a portion of the conductive paste that extends from the bottom side of the overlay substrate into the via with which it is associated to make electrical contact with the corresponding node of the first conductive grid.

In many embodiments, the overlay substrate comprises a non-conductive polymer, especially a poly(ethylene terephthalate) ("PET") sheet.

In many embodiments, the static dissipative layer or coating is transparent. In many of these embodiments, the static dissipative coating has a transparency Y as high as 90% at d=100 nm. Many embodiments of the assembly will have the static dissipative coating as a complex of a substituted polythiophene and an anion that offers a conductivity in the range of 1000 Siemens per centimeter (S/cm).

In some of the embodiments, one of the plurality of first conductive grids is a conductive grid with vias positioned around a perimeter of the overlay substrate.

Many of the areas that correspond to each data entry element of the keypad is surrounded by at least one of the first conductive grids.

Other inventive objectives are achieved by an electronic device for data entry and display that comprises an enclosure and a keypad that is adapted for data entry and display, mounted on the enclosure, as well as a protective assembly, arranged atop the keypad and secured in position by the housing, the protective assembly adapted to dissipate electrostatic charges arising from use of the keypad.

In such an electronic device, the housing is metallic and electrostatic charges dissipated by the overlay assembly are drained to the housing.

BRIEF DESCRIPTION OF THE DRAWINGS

A better understanding of the inventive concept will be obtained by reference to the appended drawings, wherein identical parts are identified with identical reference numbers and wherein.

DETAILED DESCRIPTION OF THE EMBODIMENTS

Figure 1:
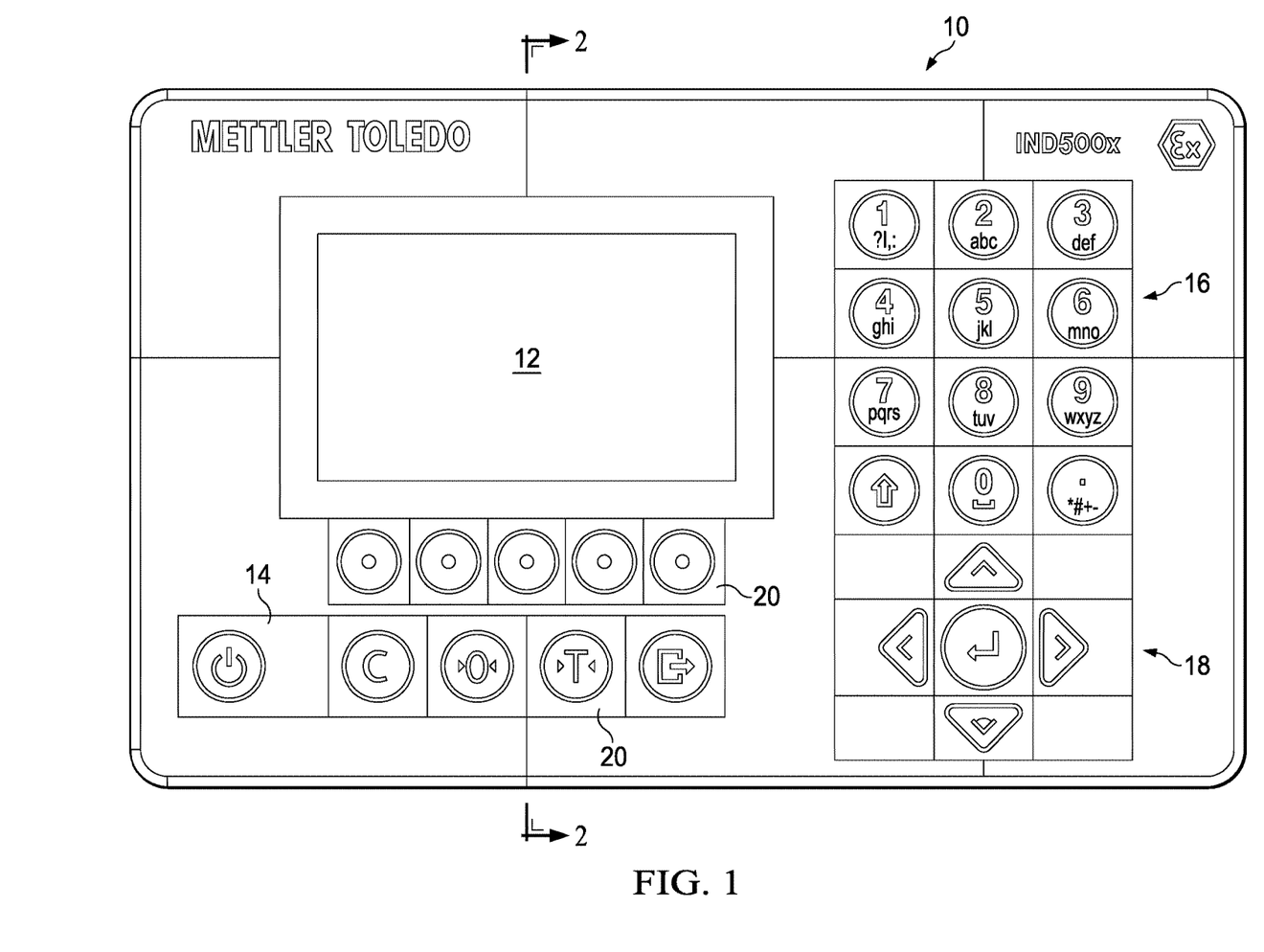
FIG. 1 is a top plan view of an assembled keypad assembly incorporating the inventive keypad overlay.

FIG. 1 shows an embodiment, in top plan view of a keypad assembly 10 that incorporates a keypad with an overlay for dissipation of electrostatic charges. The keypad illustrated here is only one example of implementing the inventive overlay, which due to their transparent nature, will not be readily noticeable to a user, although some of the features will become apparent to a user as the overlay approaches the end of its useful life and provides visual evidence that the overlay needs to be replaced. While the depicted embodiment of the keypad assembly 10 shows a typical selection and arrangement of keypad elements, it will be readily understood that other selections and arrangements of the keypad elements are possible while still being an effective implementation of the inventive concept, as the overlay itself has a very passive, but effective, role in the operation of the keypad assembly 10. For the purposes of illustrating the inventive concept, the minimal set of elements would include at least one display element 12, depicted here as a screen, and a plurality of data entry elements, such as an on/off button 14, a numeric keypad 16 with buttons for the numerals 0 through 9, a set 18 of four directional arrows with an "entry" button arranged in the middle thereof, and a plurality of functional buttons 20. As will be seen in the remaining figures, but especially in FIG. 2, the functional portions of the keypad lie below the overlay itself, which will be designated by reference number 30 in those figures.

Figure 2:
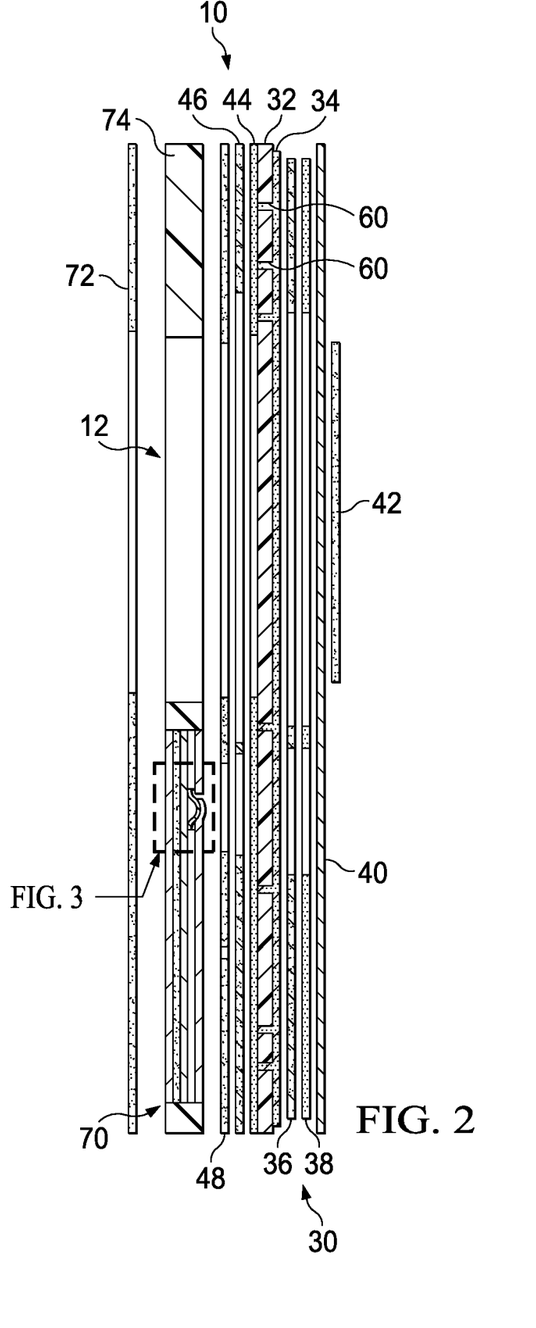
FIG. 2 is a side sectional view of the keypad assembly, including the overlay, as taken along line 2-2 of FIG. 1.

Turning then, to FIG. 2, the overlay 30 is based on and receives its structural basis from an overlay substrate 32 that is generally planar with a top side and a back side. In FIG. 2, the top side of the overlay substrate 32 is the right side thereof and the back side is the left side thereof. A plurality of layers of inks and coatings are applied to these top and back sides. To clearly show the inks and coatings, FIG. 2 is not drawn to scale. However, the overlay substrate 32 is the thickest portion of the overlay 30. It is formed of a transparent polymeric material, with poly(ethylene terephthalate) being a preferred material. An exemplary overlay substrate 32 is a textured hardcoat polyester film sold commercially under the trademark AUTOTEXT by MacDermid Autotype Inc. Critical to the functionality of the overlay 30 is a plurality of vias 60 that are formed in the overlay substrate 32. Several of these vias 60 are seen in FIG. 2. Each via 60 is precisely sized and arranged on the substrate 32, according to the predetermined layout of the display element and the data entry elements of a particular keypad for which the overlay 30 is provided. These vias 60 will be discussed below in relation to FIGS. 4-6.

After the vias 60 are formed, a pad of conductive ink 34 is applied to the top side of overlay substrate 32, in a manner that allows the ink to flow into the vias from the top side, at least partially filling them. An appropriate pad could be CLEVIOS™ F DX 2/X-L 2K, commercially available from Heraeus Deutschland Gmbh & Co.

A pattern 36 of conductive silver paste is selectively applied atop the conductive ink 34. The specifics of the selective pattern 36 will be better understood with relation to FIGS. 4 and 6, but for now, it is noted that the silver paste is positioned atop the vias, generally in interconnected linear runs. Conductive silver paste is known in the industry and a typical paste would be ACHESON™ 8208.

A pattern 38 of colored ink is applied atop the pattern 36 of conductive silver paste to obscure visibility of the pattern 36 when viewed from the top of the keypad assembly. In FIG. 1, this pattern 38 comprises the interconnected linear elements that set out borders around the display element 12 and the various data entry elements 14, 16, 18, 20. As with the conductive silver paste, the color ink is commonly used in the industry and readily known to one of skill. One example would be a JUJO™ 900 SERIES ink.

The next layer outwardly from the top side of the overlay substrate 32 is a coating 40 of a conductive polymeric material. This coating 40 provides the primary surface that is touched by a user, so it is a static-dissipative material. A material that is suitable for this coating 40 is a protective CLEVIOS™ hardcoat, commercially available from Heraeus Deutschland GmbH & Co. KG, where CLEVIOS™ is the registered trademark for its conductive polymer chemistry. According to the Heraeus website, CLEVIOS™ PEDOT/PSS is a complex of a substituted polythiophene and an anion that offers a conductivity in the range of 1000 Siemens per centimeter (S/cm). It is available in an extremely thin, electrically conductive coating. The coating has good chemical stability and a transparency Y as high as 90% at d=100 nm. The material has good thermal and ultraviolet stability. The website touts CLEVIOS™ as an antistatic coating useful for protecting integrated circuit packaging trays to prevent damage of sensitive electronic components from ESD. The website indicates that many plastics, including polycarbonates, polyethylene, polyethylene terephthalate, polyamide and polypropylene, can be coated with CLEVIOS™.

The last layer on the top side of the overlay substrate 32 is a thin insulating layer of optical ink 42. It is preferably applied only on the area projected by the display element 12 onto the static-dissipative coating 40. While the optical ink 42 is applied to clarify the display window, it does reintroduce the risk of charges collecting. A suitable method of mitigating charge collection in this area is to minimize the surface area of the insulating layer or to introduce a staggered grid of holes to encourage a low energy-flash over discharge before an accumulation capable of ignition can occur. An exemplary material for this layer is a WINDOTEX™ material as available from MacDermid Autotype Inc.

Staying with FIG. 2, attention may now be directed to the back side of the overlay substrate 32. It is a preferred practice to coat the surface of the back side with at least one layer 44 of color ink to provide the overlay substrate with a background color and also to mark the back side with a plurality of indicia, in a contrasting color, to provide the numbers on the numeric keypad, etc. Obviously, no color ink is applied in the area of the display element. It may be preferred to apply this layer 44 before the vias as formed in the substrate, as the color ink layer can act as an alignment tool for the vias.

After the color ink layer 44 is applied and the vias are formed, a pattern 46 of conductive silver paste is selectively applied onto the back side, outwardly from the color ink layer. The selective pattern 46 will effectively mirror the conductive silver paste pattern 36, as will be seen further in the description of FIGS. 5 and 6. As with pattern 36, the conductive silver paste 46 can be that sold as ACHESON™ 8208. As will be shown below, electrostatic charges arising on the top side of the overlay substrate 32 will migrate to the conductive silver paste 36, drain through a via 60 to the bottom side of the overlay substrate and be collected by the conductive silver paste 46. The interconnectivity of the lengths of silver paste 46 will move the charges to a grounded tab.

Continuing to move away from the back side of the overlay substrate 32, an adhesive layer 48 is provided, so that the overlay 30, with its various layers, can be affixed to the keypad 70, which is now described. The overlay 30 is intended to be able to be readily replaced as it is expended through use. The adhesive is preferably a double-sided pressure-sensitive adhesive on a polymeric film. Notably, no adhesive is applied to the area representing the display area.

Below the adhesive layer 48 is the mechanical embodiment of the keypad 70, providing the display and data entry elements, and below this is a further adhesive layer 72, which is used to affix the keypad assembly 10 to a metal equipment enclosure (not shown) that contains the electronics for the device. Most of the features of the keypad are seen in an enlarged manner in FIG. 3, but FIG. 2 shows a transparent keypad spacer 74, through which the display element 12 is viewed. A polymeric sheet, especially a polycarbonate material, is typically used as the keypad spacer 74.

Figure 3:
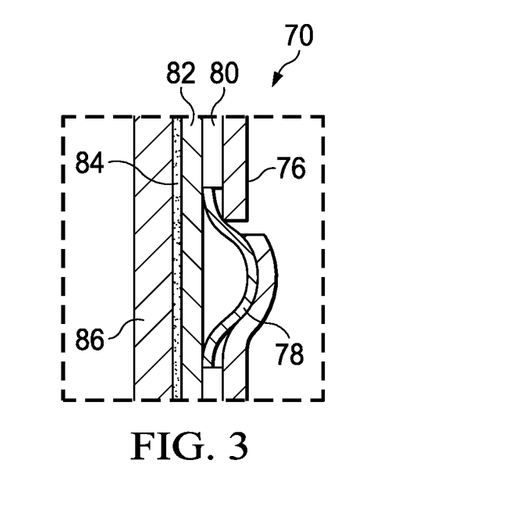
FIG. 3 is an enlarged view of a portion of FIG. 2, showing operational features of the keypad on which the keypad overlay is used.

Attention is now directed to FIG. 3, with its enlarged view of a portion of FIG. 2, showing operational features of the keypad on which the keypad overlay is used. Moving from right to left in the figure, an upper layer 76 of the keypad is a polymeric layer, typically a poly(ethylene terephthalate) such as LUMIRROR™ T60 polyester sold by Toray Industries Ltd. Note that the upper layer 76 is selectively cut to facilitate physical movement of the metal domes 78, one of which is below each of the data entry elements. The metal domes 78, as well as an interlayer 80 that comprises an adhesive, are positioned between the upper layer 76 and a circuit layer 82, which is typically of the same composition as the upper layer 76. A further adhesive layer 84 affixes the circuit layer 82 to a circuit spacer layer 86.

Figure 4:
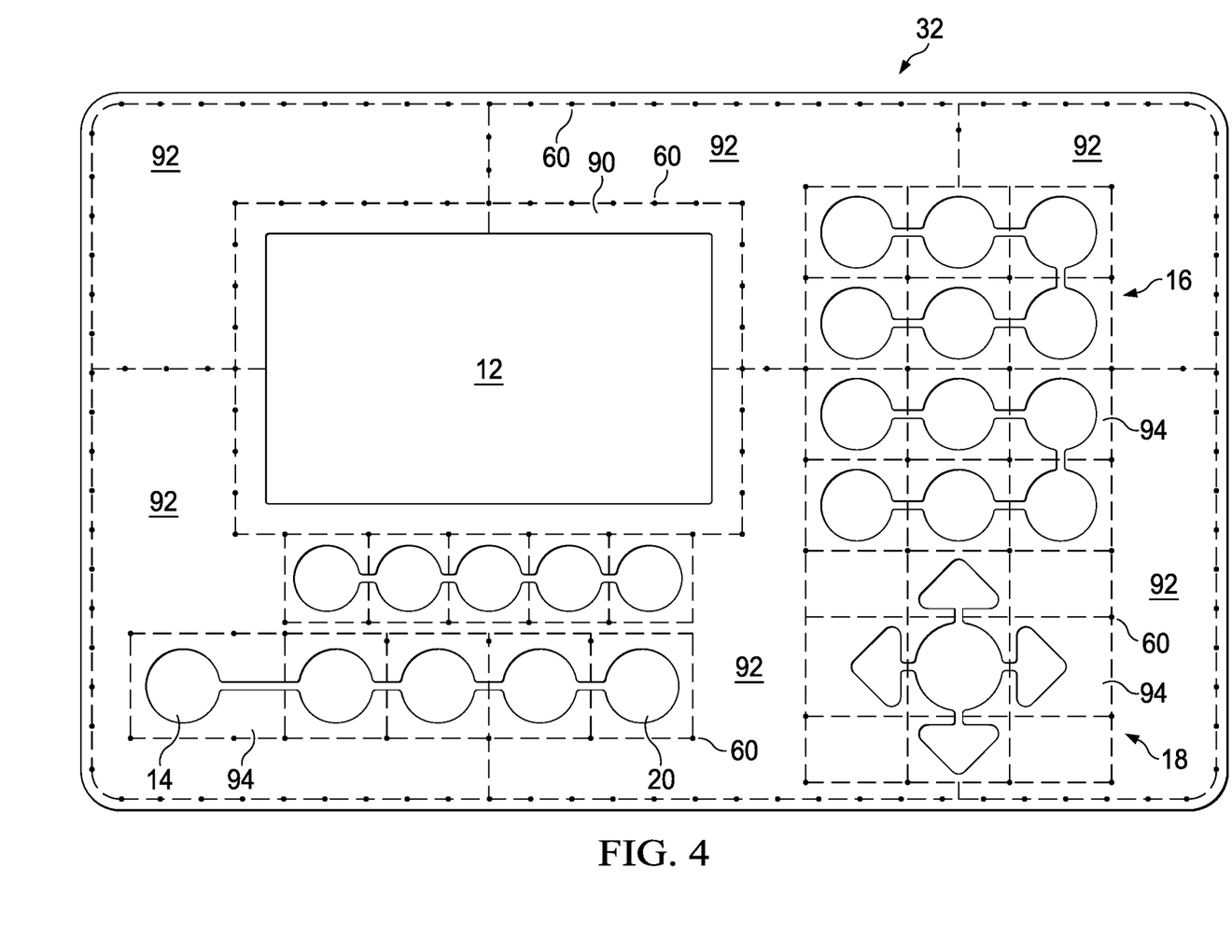
FIG. 4 is a top plan view of the overlay substrate, showing the location of vias in the substrate.

FIG. 4 is a top plan view of the overlay substrate 32, and is presented here to show the location of the vias 60 that are formed in the overlay substrate. In this figure, structures such as the display element 12, the on/off button 14, the numeric keypad 16, the set of directional arrows 18 and the set of functional buttons 20 are recognizable from FIG. 1. A plurality of dashed lines are used to portray borders that divide the surface area of the overlay substrate 32 into enclosed zones. Due to the coatings atop the overlay substrate 32, the "areas" are really "volumes," although the depth is quite small relative to the width and breadth. Accordingly, there are "enclosed volumes" rather than enclosed areas or zones. The vias 60 are depicted as dots along the dashed lines. One of the dashed lines is provided around the periphery of the overlay substrate 32. There are three types of enclosed volumes presented in the figure. By far the largest is a Type 1 volume 90. There is one of these, and it encompasses a volume occupied by the display element 12. A plurality of smaller volumes are Type II enclosed volumes 92. These encompass volumes that are subject to being touched by a user, but which do not have an underlying data entry element 14, 16, 18 or 20. A plurality of rectangular encompassed volumes are the Type III volumes 94. Each of these has one underlying data entry element. These Type III enclosed volumes 94 are considered to be the areas at highest risk for an electrostatic charge to arise.

The series of dashed lines in FIG. 4 clearly depict a pattern for laying down the layer 36 of conductive silver paste seen in side sectional view in FIG. 2, as well as a pattern for covering the conductive silver paste layer with layer of color ink 38.

It is preferred in the inventive concept to divide the surface area of the overlay substrate 32, and especially the Type III zones 94, so that the surface area is less than 500 mm$^2$. According to IEC 60079-0:2017, the maximum unprotected area of an insulating material is 500 mm$^2$. The color ink layer 38 that covers the conductive silver paste layer 36 provides a watermark feature, which enables the user to visually detect when the conductive polymeric coating 40 has been damaged or worn off, to the extent that the overlay needs to be replaced. By framing the Type III zones 94 using the conductive silver paste, damaged areas will not exceed the 500 mm$^2$ required per the standard. A preferred color ink 38 is an ink from the 9000 Series PET, commercially-available from Jujo Chemical Co. Ltd. of Japan. This ink is suitable for high-speed printing with excellent adhesion on PET.

The vias 60 are precisely sized and arranged on the overlay substrate 32. Each via 60 is cut into the substrate 32, preferably by a laser, providing a precisely positioned and sized conduit between the top and bottom sides of the substrate, for transmission of electrostatic charges. When filled with conductive ink, as will be described, the vias 60 provide a grounding solution, draining charges from the top side to an inner conductive collector surface on the bottom side of the substrate. From there, a conductive tab connects the inner conductive collector surface to a metal equipment enclosure of the device. A wire connects the equipment enclosure to earth ground, thus preventing charge build-up on the plastic overlay outer surface. The vias are small and not readily noticeable and thus do not detract from the overlay appearance.

Figure 5:
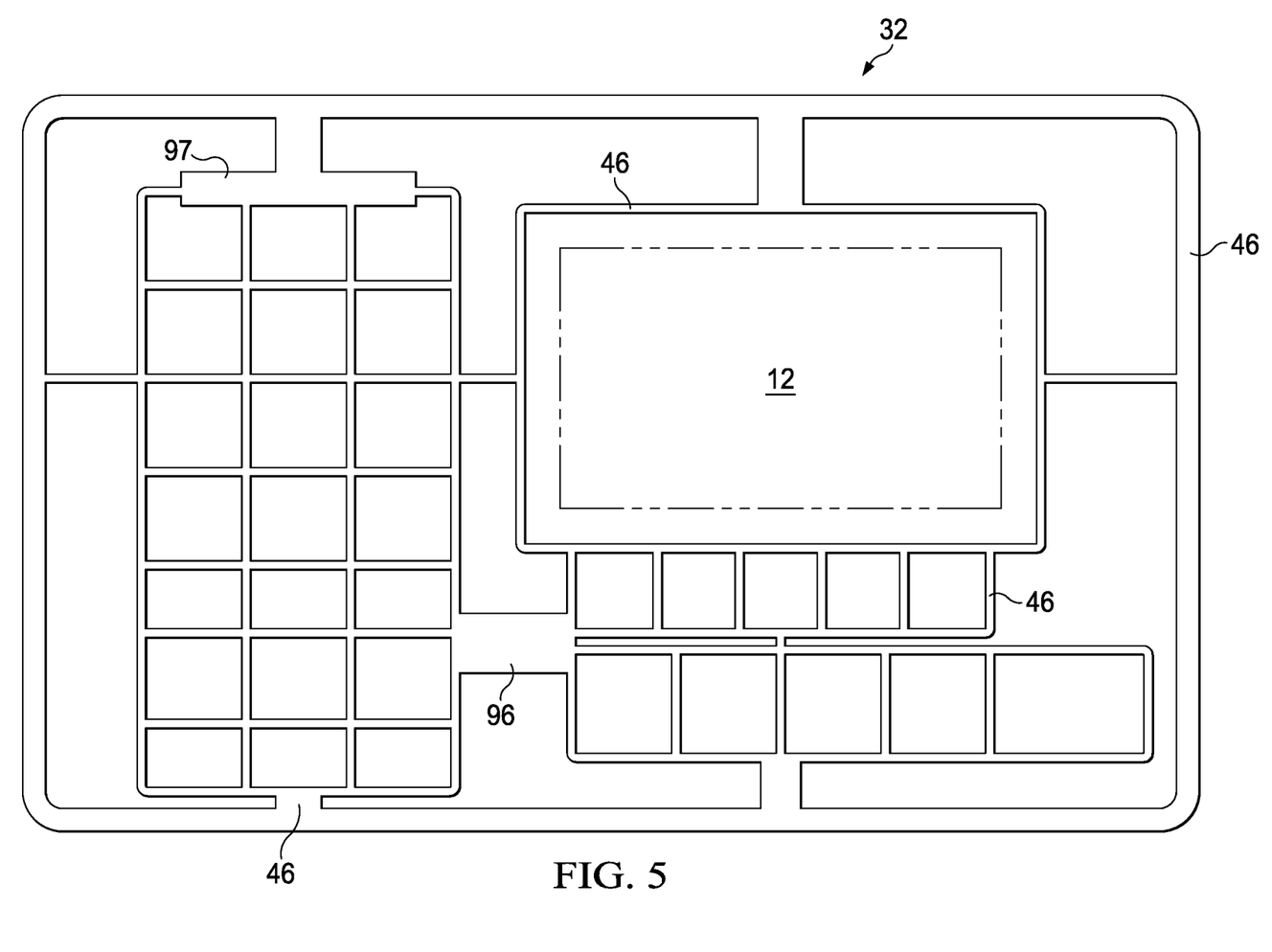
FIG. 5 is a bottom plan view of a layer of conductive paste deposited on a bottom surface of the overlay substrate.

FIG. 5 shows a bottom plan view of a bottom surface of the overlay substrate 32. Note that the display area 12 is moved to the right side of the pad arrangement, due to the view from the bottom side. This illustrates a few different points. One point is how the conductive silver paste layer 46 on the bottom side mirrors the pattern of conductive silver paste on the top side, showing how the vias communicate and interconnect these conductive layers. The second point is how the pattern of the silver paste layer 46 has at least one widened portion 96 that is used to connect the silver paste layer 46 to a grounding pad or wire. A second widened portion 97 is also shown.

Figure 6:
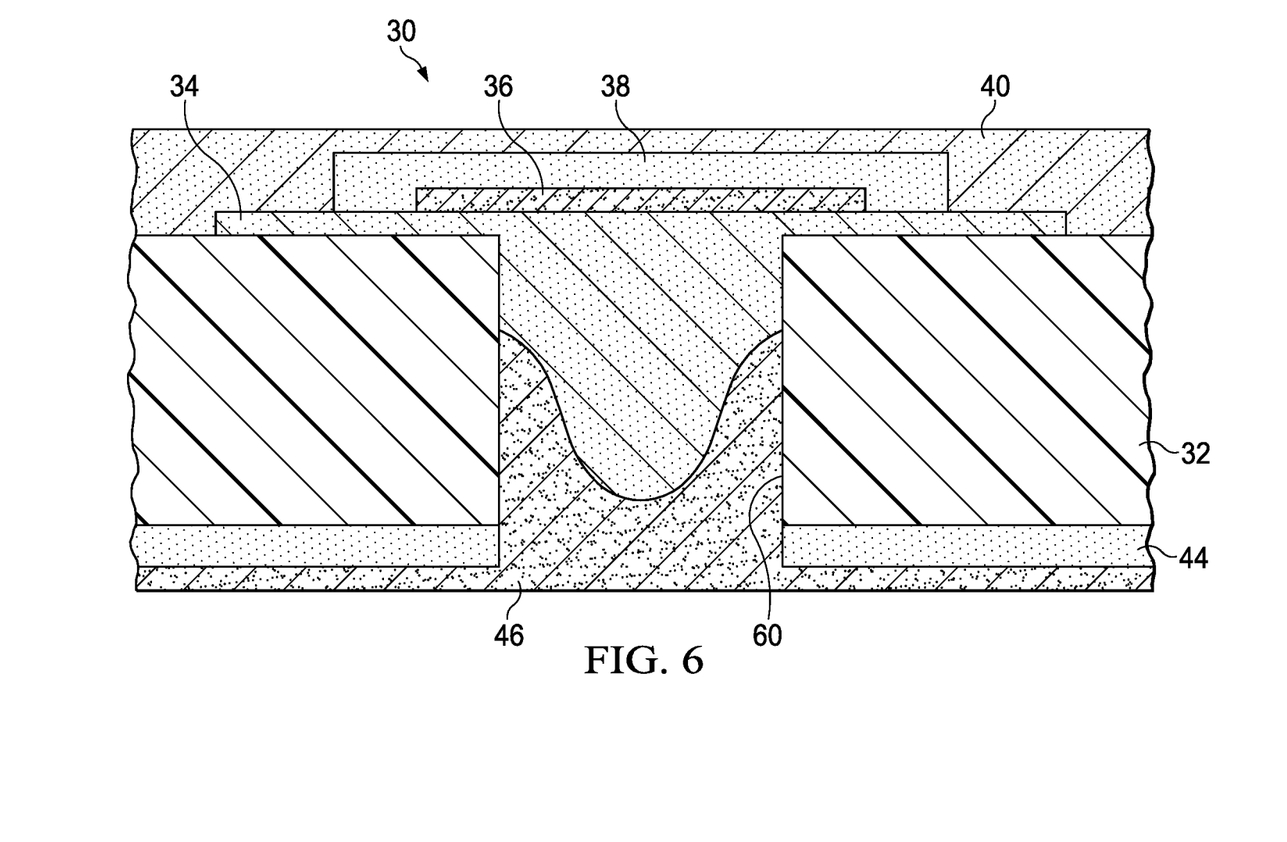
FIG. 6 is an enlarged side sectional view of the overlay depicting a via and all printed layers of the overlay.

FIG. 6 is an enlarged side sectional view of the overlay 30 focusing on a single via 60, formed in nonconductive overlay substrate 32. As mentioned above, placement of conductive ink 34 on the top side of the overlay substrate 32 allows the conductive ink 34 to flow into the via 60, at least partially filling it. Because color ink layer 44 is applied to the bottom side of overlay substrate 32 before the vias 60 are formed, it does not flow into the vias, but when the conductive paste layer 46 is applied to the bottom side, it completes the filling of the via 60, so that an electrical communication is established between conductive paste layers 36, 46. The shape and location of an interface between conductive paste layers 36, 46 can vary, and the illustrated interface is only exemplary. Color ink layer 38 covers conductive paste layer 36, so that the former is only visible if the color ink layer has been damaged or worn. The static-dissipative conducting layer 40 is in communication, through conductive ink 34 with conductive paste layer the conductive paste layer 36. Charges arising in any of the zones 90, 92, 94 are thereby able to freely flow from the top side of the overlay substrate 32 to the conductive paste layer 46 on the bottom side. From there, these charges flow by their potential difference to the ground connection provided by the widened portion 96, shown in FIG. 5.

Figure 7:
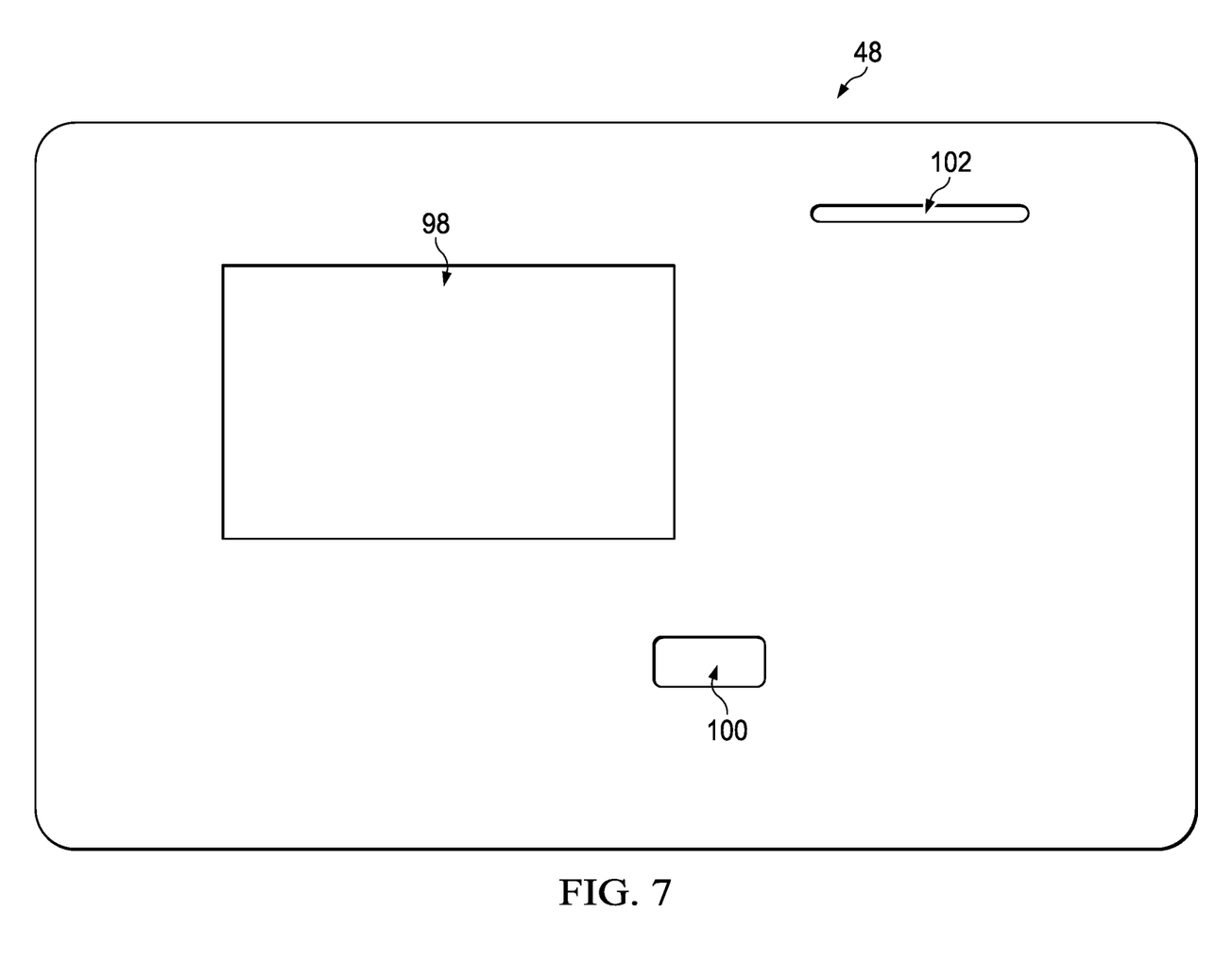
FIG. 7 is a top plan view of a rear adhesive layer of the keyboard overlay.

FIG. 7 is a top plan view of the rear adhesive layer 48 of the overlay assembly 30. Pressure sensitive adhesive is distributed across the entire top surface of rear adhesive layer 48, typically a material provided by 3M as product 9672LE, except at cutouts 98, 100, 102. Cutout 98 corresponds to the display area, and cutouts 100, 102 correspond to widened portions 96 and 97.

REFERENCE NUMBERS 10 keypad assembly
12 display element
14 on/off button
16 numeric keypad
18 set of directional arrows
20 set of functional buttons
30 overlay
32 overlay substrate
34 conductive ink
36 conductive silver paste
38 color ink
40 conductive polymeric coating
42 insulating optical ink
44 color ink
46 conductive silver paste
48 adhesive layer
60 vias
70 keypad
72 further adhesive layer
74 keypad spacer
76 upper layer
78 metal domes
80 interlayer
82 circuit layer
84 further adhesive layer
86 circuit spacer layer
90 Type I enclosed volume
92 Type II enclosed volume
94 Type III enclosed volume
96, 97 widened connection to ground
98, 100, 102 cutouts

What is claimed is:

1. An assembly for protecting, from electrostatic discharge, a plastic keypad having data entry elements and at least one display element, the assembly comprising:
   an overlay substrate, having a top side and a back side, the overlay substrate further having a plurality of precisely-positioned vias formed therethrough, the top side having a top surface coated with a static-dissipative layer of a conductive polymer and the back side having a back surface printed with at least one layer of color ink, the at least one layer of color ink depicting a plurality of alpha-numerical and pictorial elements of the keypad; and
   an electrically-conductive arrangement, disposed on the overlay substrate to collect electrostatic charges on the top side, transfer the electrostatic charges to the back side through the plurality of vias and drain the transferred electrostatic charges to a ground, said electrically-conductive arrangement comprising:
      at least one first conductive grid printed onto the top surface of the overlay substrate beneath the layer of conductive polymer, the at least one first conductive grid dividing the top surface into a plurality of surrounded areas, each of which is equal to or smaller than a predetermined size, each of the first conductive grids comprising a plurality of nodes, each node positioned atop, and extending into, a corresponding one of the plurality of precisely-placed vias;
      at least one second conductive grid printed onto the back surface of the overlay substrate, below the at least one layer of color ink, such that each second conductive grid corresponds in size and shape to one of the first conductive grids, each of the second conductive grids comprising a plurality of nodes, each node positioned below, and extending into, a corresponding one of the plurality of precisely-placed vias; and
      at least one conductive connection that communicates to ground each second conductive grid.

2. The assembly of claim 1, wherein each of the first conductive grids and the second conductive grids comprise lengths of a conductive paste printed on the overlay substrate.

3. The assembly of claim 2, wherein a layer of color ink is applied atop the lengths of conductive paste in each of the first conductive grids.

4. The assembly of claim 3, wherein the nodes of each of the first conductive grids comprise:
   a plug of a conductive polymer applied to each of the precisely-positioned vias from the top side of the overlay substrate, the plug having a body portion that extends into the via and a flange portion, having a diameter that is larger than a diameter of the via, that extends onto the top surface of the overlay substrate;
   a length of the conductive paste applied atop the plug; and
   a length of the color ink applied atop the length of conductive paste.

5. The assembly of claim 4, wherein the nodes of each of the second conductive grids comprises a portion of the conductive paste that extends from the bottom side of the overlay substrate into the via with which it is associated to make electrical contact with the corresponding node of the first conductive grid.

6. The assembly of claim 3, wherein the nodes of each of the second conductive grids comprises a portion of the conductive paste that extends from the bottom side of the overlay substrate into the via with which it is associated to make electrical contact with the corresponding node of the first conductive grid.

7. The assembly of claim 2, wherein the nodes of each of the second conductive grids comprises a portion of the conductive paste that extends from the bottom side of the overlay substrate into the via with which it is associated to make electrical contact with the corresponding node of the first conductive grid.

8. The assembly of claim 1, wherein the overlay substrate comprises a non-conductive polymer.

9. The assembly of claim 8, wherein the non-conductive polymer is poly(ethylene terephthalate) ("PET") sheet.

10. The assembly of claim 1, wherein the static dissipative coating is transparent.

11. The assembly of claim 10, wherein the static dissipative coating has a transparency Y as high as 90% at d=100 nm.

12. The assembly of claim 10, wherein the static dissipative coating is a complex of a substituted polythiophene and an anion that offers a conductivity in the range of 1000 Siemens per centimeter (S/cm).

13. The assembly of claim 1, wherein one of the plurality of first conductive grids is a conductive grid with vias positioned around a perimeter of the overlay substrate.

14. The assembly of claim 13, wherein an area corresponding to each data entry element of the keypad is surrounded by at least one of the first conductive grids.

15. An electronic device for data entry and display, comprising:
    an enclosure;
    a keypad adapted for data entry and display, mounted on the enclosure; and
    an overlay assembly according to claim 1, arranged atop the keypad and secured in position by the enclosure, the overlay adapted to dissipate electrostatic charges arising from use of the keypad.

16. The electronic device of claim 15, wherein:
    the enclosure is metallic; and
    electrostatic charges dissipated by the overlay are drained to the enclosure.

17. The assembly of claim 1, wherein an area corresponding to each data entry element of the keypad is surrounded by at least one of the first conductive grids.

* * * * *

UNITED STATES PATENT AND TRADEMARK OFFICE
CERTIFICATE OF CORRECTION

PATENT NO. : 12,035,449 B2
APPLICATION NO. : 17/585893
DATED : July 9, 2024
INVENTOR(S) : Qian et al.

It is certified that error appears in the above-identified patent and that said Letters Patent is hereby corrected as shown below:

In the Specification

In Column 4, Line 13, please delete "AUTOTEXT" and insert -- AUTOTEX™ --.

In Column 4, Line 27, please delete "Gmbh" and insert -- GmbH --.

Signed and Sealed this
Twentieth Day of August, 2024

Katherine Kelly Vidal
*Director of the United States Patent and Trademark Office*